US011924995B2

United States Patent
Wang et al.

(10) Patent No.: US 11,924,995 B2
(45) Date of Patent: Mar. 5, 2024

(54) WATER COOLING HEAD WITH SPARSE AND DENSE FINS

(71) Applicant: FORCECON TECHNOLOGY CO., LTD., Zhubei (TW)

(72) Inventors: Chi-Chuan Wang, Hsinchu (TW); Cheng-Chen Cheng, New Taipei (TW); Chuan-Chan Huang, Hsinchu (TW); Jen-Chieh Huang, Hsinchu (TW)

( * ) Notice: Subject to any disclaimer, the term of this patent is extended or adjusted under 35 U.S.C. 154(b) by 148 days.

(21) Appl. No.: 17/238,752

(22) Filed: Apr. 23, 2021

(65) Prior Publication Data
US 2022/0346269 A1    Oct. 27, 2022

(51) Int. Cl.
*F28F 7/00* (2006.01)
*H05K 7/20* (2006.01)

(52) U.S. Cl.
CPC ....... *H05K 7/20218* (2013.01); *H05K 7/2039* (2013.01)

(58) Field of Classification Search
CPC .......................... H05K 7/20218; H05K 7/2039
USPC ....................................................... 165/80.4
See application file for complete search history.

(56) References Cited

U.S. PATENT DOCUMENTS

| 7,215,545 | B1* | 5/2007 | Moghaddam | ....... H01L 23/3732 361/708 |
| 8,157,001 | B2* | 4/2012 | Hom | .................. H05K 7/20281 165/300 |
| 8,464,781 | B2* | 6/2013 | Kenny | .................... F28D 15/00 165/80.4 |
| 10,062,826 | B2* | 8/2018 | Casey | ..................... F01N 5/025 |
| 2017/0231115 | A1* | 8/2017 | Kobayashi | ................ F28F 1/40 |
| 2019/0364694 | A1* | 11/2019 | Lin | ........................ H01L 23/473 |
| 2020/0310234 | A1* | 10/2020 | Liu | ........................ G03B 21/16 |
| 2021/0127524 | A1* | 4/2021 | Ahmadi | ............... H01L 23/3672 |
| 2022/0087061 | A1* | 3/2022 | Whitmore | .......... H05K 7/20218 |
| 2022/0346269 | A1* | 10/2022 | Wang | ................ H05K 7/20218 |

* cited by examiner

*Primary Examiner* — Claire E Rojohn, III
(74) *Attorney, Agent, or Firm* — Egbert, McDaniel & Swartz, PLLC

(57) ABSTRACT

A water cooling head with sparse and dense fins, including a main body, a first fin set and a second fin set. Wherein a chamber is formed inside the main body, the main body has a first plate and a second plate, the main body forms an inlet channel and an outlet channel, so that the cooling water passes through the chamber. The first fin set and the second fin set are arranged in the chamber, and the first fin set and the second fin set are connected to the first plate respectively. The first fin set comprises several first fins spaced apart, the first fins divide the chamber to form several first channels. The second fin set comprises several second fins spaced apart, the second fins divide the chamber to form several second channels. The water cooling head can increase the overall heat sinking efficiency.

8 Claims, 8 Drawing Sheets

WATER COOLING HEAD WITH SPARSE AND DENSE FINS

CROSS-REFERENCE TO RELATED U.S. APPLICATIONS

Not applicable.

BACKGROUND OF THE INVENTION

1. Field of the Invention

The present invention relates generally to a component of water-cooling heat sinks, and more particularly to a water cooling head with sparse and dense fins.

2. Description of Related Art Including Information Disclosed Under 37 CFR 1.97 and 37 CFR 1.98

Equipment that generates a lot of heat energy, including electronic devices, can be cooled down by using water-cooling heat sinks. The water cooling head is a component of the aforementioned water-cooling heat sinks. The known water cooling head includes a casing, an inlet pipe and a delivery pipe. Wherein the casing has a bottom plate and a top plate, the bottom plate is opposite to the top plate. A storage space is formed inside the casing, the inlet pipe and the delivery pipe communicate with the storage space respectively, so that the cooling water flows through the storage space. A first fin set and a second fin set are vertically opposite to each other and arranged in the storage space. The first fin set comprises several first fins spaced apart. The second fin set comprises several second fins spaced apart. The first fins are connected to the bottom plate respectively. The second fins are connected to the top plate respectively. The thickness of the first fin is larger than the thickness of the second fin. The configuration density of the first fins is lower than the configuration density of the second fins.

When the known water cooling head is configured on a heat source, the bottom plate abuts on the heat source, the heat energy is transferred through the bottom plate to the first fin set, and the first fin set transfers the heat energy to the second fin set. The cooling water flows into the storage space through the inlet pipe. The cooling water contacts the first fin set and the second fin set to form heat exchange. The cooling water absorbs heat energy and leaves the storage space through the delivery pipe. The cooling water leaving the storage space can release heat energy to the outside through the other heat sinking elements (e.g. cooling fan) of the water-cooling heat sink.

The water cooling head uses the bottom plate to absorb the heat energy of the heat source. The heat energy absorbed by the bottom plate must be indirectly transferred through the first fin set to the second fin set, when the heat energy passes through the first fin set, the cooling water forms heat exchange with the first fin set, so that the heat energy transferred to the second fin set is reduced, the cooling effect of the second fin set is low, and the overall heat sinking efficiency of the water cooling head is low.

BRIEF SUMMARY OF THE INVENTION

The primary objective of the present invention is to provide a water cooling head with sparse and dense fins.

Based on the aforementioned objective, the present invention provides a water cooling head with sparse and dense fins, which includes a main body. A chamber is formed inside the main body, and the main body has a first plate and a second plate. The first plate and the second plate are opposite to each other. The chamber is located between the first plate and the second plate. The main body forms an inlet channel and an outlet channel, the inlet channel and the outlet channel communicate with the chamber respectively, so that the cooling water flows into the chamber through the inlet channel, and leaves the chamber through the outlet channel.

A first fin set is arranged in the chamber. The first fin set comprises several first fins spaced apart, and the first fin set is connected to the first plate, so as to absorb and guide the heat energy of the first plate. The first fins divide the chamber to form several first channels.

A second fin set is arranged in the chamber. The second fin set comprises several second fins spaced apart, and the second fin set is connected to the first plate, so as to absorb and guide the heat energy of the first plate. The second fins divide the chamber to form several second channels.

Wherein the first fin set is adjacent to the inlet channel, the second fin set is located between the first fin set and the outlet channel. The chamber forms a communication region between the first fin set and the second fin set. The communication region communicates with the first channels and the second channels, so that the cooling water flows into the chamber through the inlet channel, and leaves the chamber through the first channels, the communication region, the second channels and the outlet channel in turn.

The thickness of the first fin is larger than the thickness of the second fin, and the total surface area of the first fins is smaller than the total surface area of the second fins.

With the innovative structure type and technical characteristic, the present invention can increase the overall heat sinking efficiency in comparison to prior art.

DETAILED DESCRIPTION OF THE INVENTION

Figure 1:
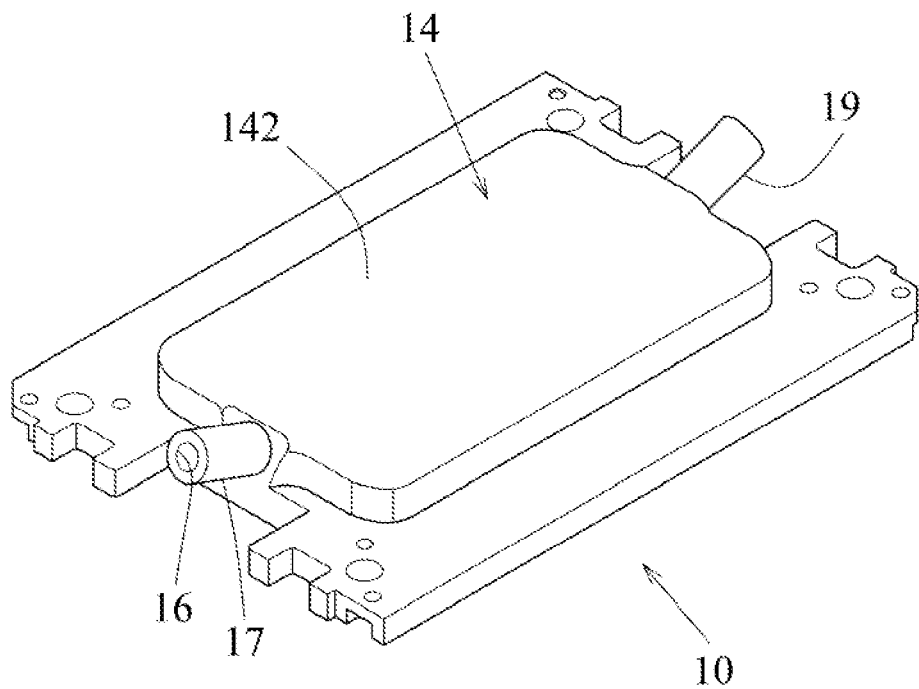
FIG. 1 is a stereogram of the preferred embodiment of the present invention.
Figure 2:
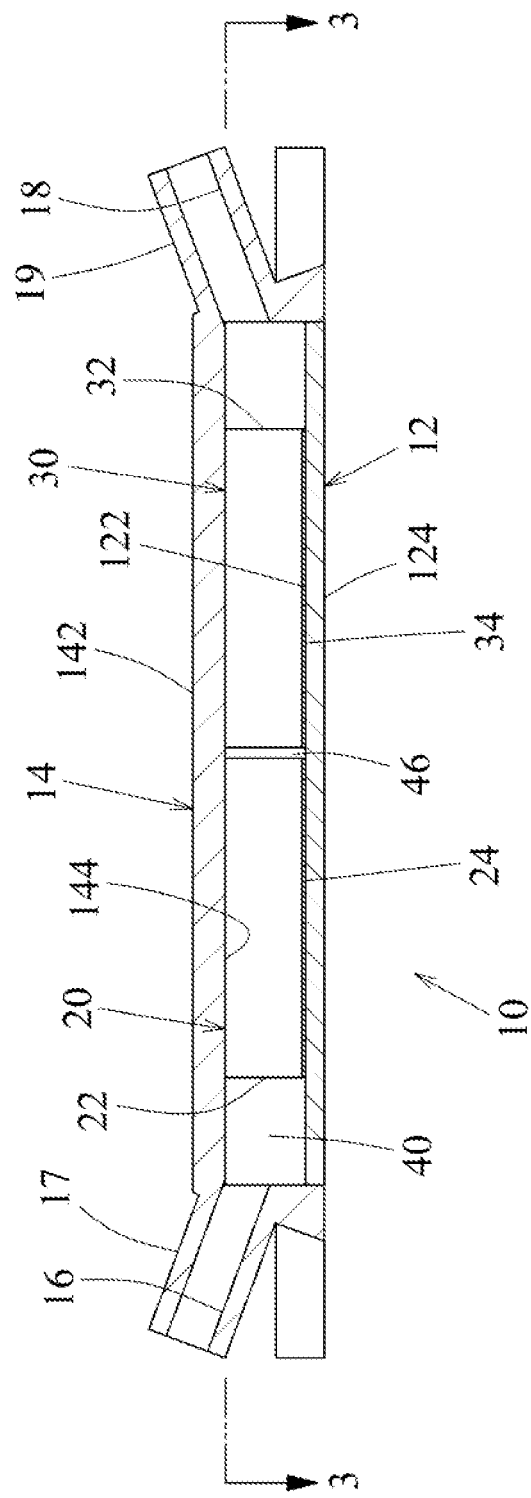
FIG. 2 is a sectional view of the preferred embodiment of the present invention.

As shown in FIG. 1 to FIG. 9, the preferred embodiment of the present invention includes a main body 10, a first fin set 20 and a second fin set 30. Wherein a chamber 40 is formed inside the main body 10, the main body 10 has a first plate 12 and a second plate 14, the first plate 12 and the second plate 14 are opposite to each other, and the chamber 40 is located between the first plate 12 and the second plate 14. The first plate 12 abuts on a heat source 92, so as to absorb and conduct the heat energy of the heat source 92, the heat source 92 can be a processor, an arithmetic unit or a heat energy generating equipment or constant temperature plate. The aforementioned specific examples of the heat source 92 cannot limit the explanation of the use of the present invention. The main body 10 forms an inlet channel 16 and an outlet channel 18, the inlet channel 16 and the outlet channel 18 communicate with the chamber 40 respectively, so that the cooling water 94 flows into the chamber 40 through the inlet channel 16, and leaves the chamber 40 through the outlet channel 18.

The first fin set 20 and the second fin set 30 are arranged in the chamber 40 respectively, the first fin set 20 and the second fin set 30 are connected to the first plate 12 respectively, so that the first fin set 20 and the second fin set 30 absorb and guide the heat energy of the first plate 12 respectively. The first fin set 20 comprises several first fins 22 spaced apart, and the first fins 22 are vertically arranged between the first plate 12 and the second plate 14. The first fins 22 divide the chamber 40 to form several first channels 42. The second fin set 30 comprises several second fins 32 spaced apart, and the second fins 32 are vertically arranged between the first plate 12 and the second plate 14, the second fins 32 divide the chamber 40 to form several second channels 44.

The first fin set 20 is adjacent to the inlet channel 16, the second fin set 30 is located between the first fin set 20 and the outlet channel 18, the chamber 40 forms a communication region 46 between the first fin set 20 and the second fin set 30, the communication region 46 communicates with the first channels 42 and the second channels 44, so that the cooling water 94 flows into the chamber 40 through the inlet channel 16, and leaves the chamber 40 through the first channels 42, the communication region 46, the second channels 44 and the outlet channel 18 in turn.

The thickness t1 of the first fin 22 is larger than the thickness t2 of the second fin 32, and the total surface area of the first fins 22 is smaller than the total surface area of the second fins 32.

Figure 7:
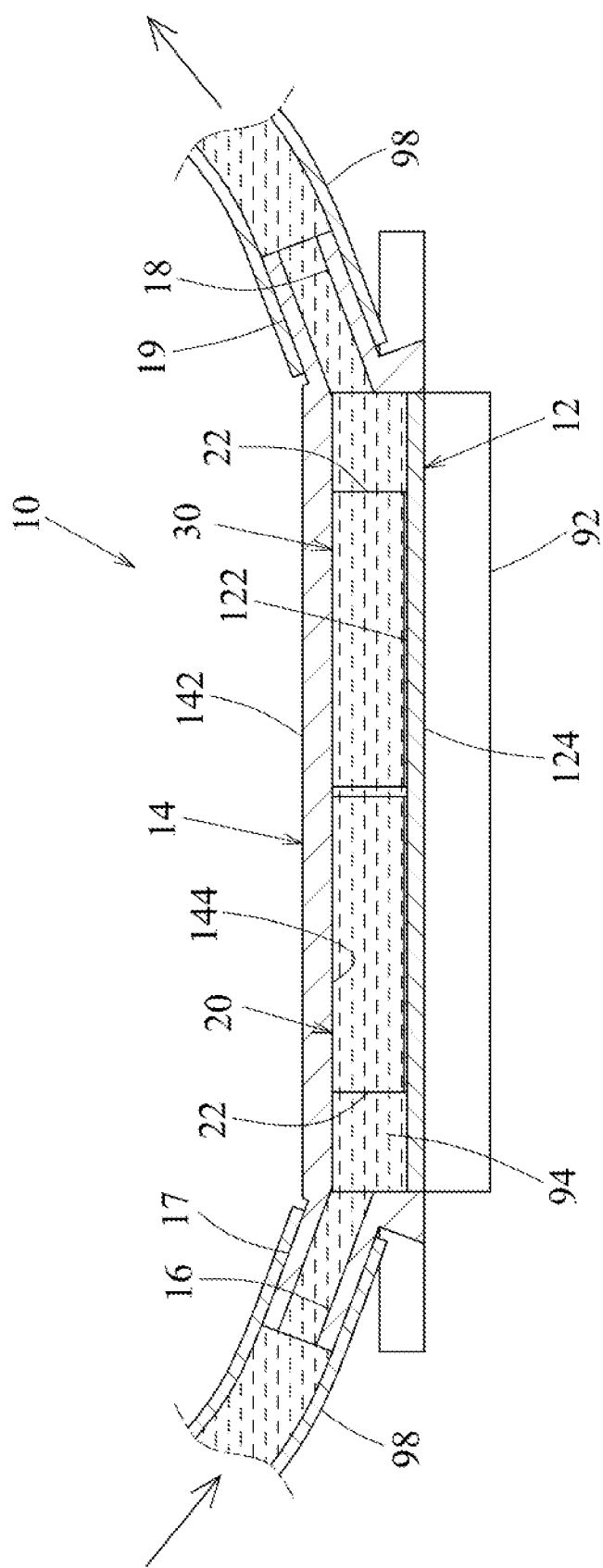
FIG. 7 is a section view of an operating state in the preferred embodiment of the present invention.
Figure 8:
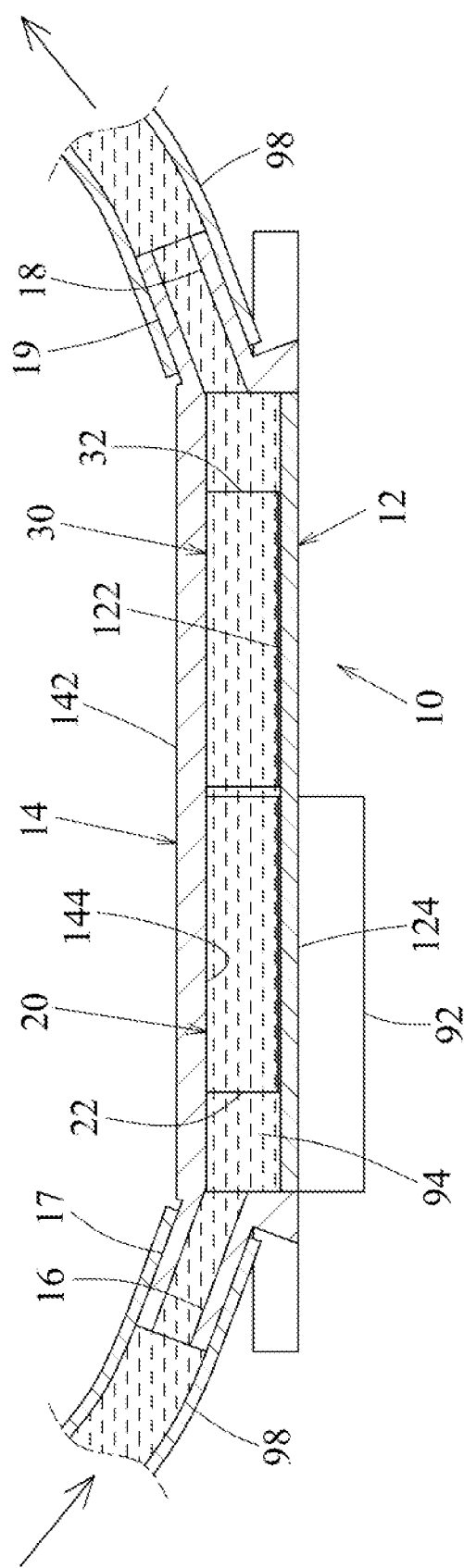
FIG. 8 is a section view of another operating state in the preferred embodiment of the present invention.
Figure 9:
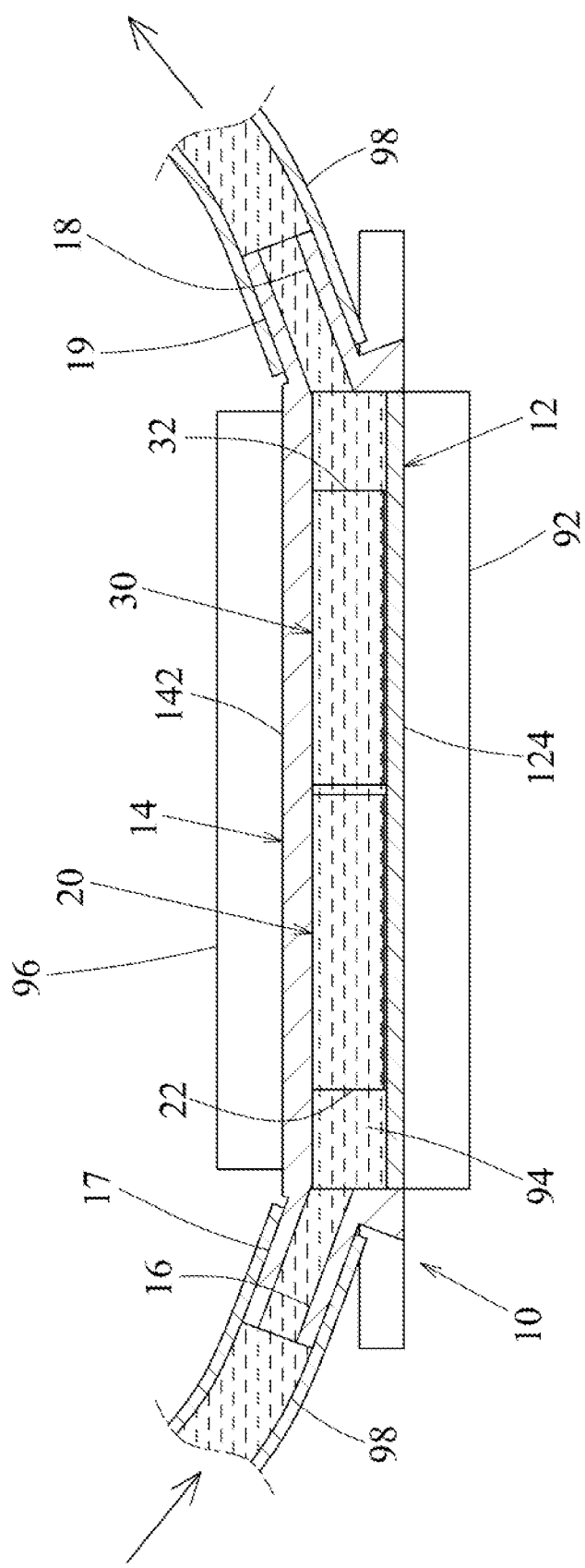
FIG. 9 is a section view of the third operating state in the preferred embodiment of the present invention.

As shown in FIG. 7 to FIG. 9, the first plate 12 abuts on the heat source 92, the heat energy is transferred from the heat source 92 to the first plate 12, and then the first plate 12 transfers the heat energy to the first fin set 20 and the second fin set 30. The cooling water 94 flows through the first channels 42 and the second channels 44 in turn. The first fins 22 and the second fins 32 form heat exchange with the cooling water 94 respectively. The cooling water 94 is heated up, and then the cooling water 94 leaves the chamber 40 through the outlet channel 18. The first fin set 20 and the second fin set 30 absorb the heat energy transferred through the first plate 12 from the heat source 92 continuously, and the heat energy is transferred to the cooling water 94. According to the attitudes of the main body 10 in the three-dimensional space, when the cooling water 94 passes through the chamber 40, the cooling water 94 can contact the part of the first plate 12 not in contact with the first fin set 20 and the second fin set 30, at this point, the cooling water 94 forms heat exchange with the first plate 12, so as to absorb the heat energy transferred through the first plate 12 from the heat source 92.

In the preferred embodiment, the first fin set 20 and the second fin set 30 are connected to the first plate 12 respectively, so that the heat energy is transferred to the first fin set 20 and the second fin set 30 respectively through the first plate 12. In comparison to prior art, the intermediate medium for transferring the heat energy from the heat source 92 to the second fin set 30 is reduced, so that the second fin set 30 can fully transfer heat energy, the overall heat sinking efficiency is increased.

When the cooling water 94 passes through the first fin set 20, the cooling water 94 exchanges heat with the first fin set 20 and heats up, and then when the cooling water 94 passes through the second fin set 30, as the total surface area of the second fins 32 is larger than the total surface area of the first fins 22, the heat exchange effect between the second fins 32 and the cooling water 94 remains, the effect of temperature rise of the cooling water 94 is reduced, and the overall heat sinking efficiency is increased.

In the flow direction of the cooling water 94 through the chamber 40, in relation to the second fin set 30, the first fin set 20 is located in the upstream, with the formation of the communication region 46, the cooling water 94 merges through the first channels 42 and enters the communication region 46, and splits into the second channels 44 from the communication region 46, the cooling water 94 through the first channels 42 is mixed in the communication region 46, so as to avoid a part of the cooling water 94 at relatively high temperature reducing the heat exchange efficiency in the second channels 44. The communication region 46 enables the cooling water 94 to be evenly distributed into the second channels 44, the flow smoothness of the cooling water 94 is enhanced, preventing a part of the second channels 44 from forming locally high pressure or locally low pressure.

The cooling water 94 is not limited to water, the cooling water 94 can be water, liquid coolant with good flowability or mixture of coolant and water.

One side of the first plate 12 facing the chamber 40 is the first surface 122, the first fin set 20 and the second fin set 30 are closely connected to the first surface 122. The first plate 12 has a heat absorption side, the heat absorption side 124 and the first surface 122 are opposite to each other in the thickness direction of the first plate 12, so that the first plate 12 contacts the heat source 92 through the heat absorption side 124, and transfers the heat energy of the heat source 92 to the first fin set 20 and the second fin set 30.

The total volume of the first channels 42 is defined as $\Sigma V1$, the total volume of the second channels 44 is $\Sigma V2$, and $\Sigma V1$ is close or equal to $\Sigma V2$, so that the cooling water 94 passes through the first fin set 20 and the second fin set 30 smoothly. Furthermore, in the preferred embodiment, $0.9 \cdot \Sigma V1 < \Sigma V2 < 1.1 \cdot \Sigma V1$; $\Sigma V1$ is close or equal to $\Sigma V2$, so that the flow velocity of the cooling water 94 through the first fin set 20 is close or equal to the flow velocity of the cooling water 94 through the second fin set 30. The relative frictions between the cooling water 94 and the first fins 22 and the second fins 32 are approximately consistent, the flow smoothness of the cooling water 94 is enhanced.

The first fin set 20 includes a first basal disc 24, the first basal disc 24 closely contacts the first surface 122, the first fins 22 are vertically arranged on the first basal disc 24. The second fin set 30 includes a second basal disc 34, the second basal disc 34 closely contacts the first surface 122, the second fins 32 are vertically arranged on the second basal disc 34. The first basal disc 24 and the second basal disc 34 closely contact the first surface 122, the reliability of transferring the heat energy through the first plate 12 to the first basal disc 24 and the second basal disc 34 respectively can be enhanced. The first fins 22 vertically arranged on the first basal disc 24 can enhance the setting convenience of the first fin set 20. The second fins 32 vertically arranged on the second basal disc 34 can enhance the setting convenience of the second fin set 30.

Figure 3:
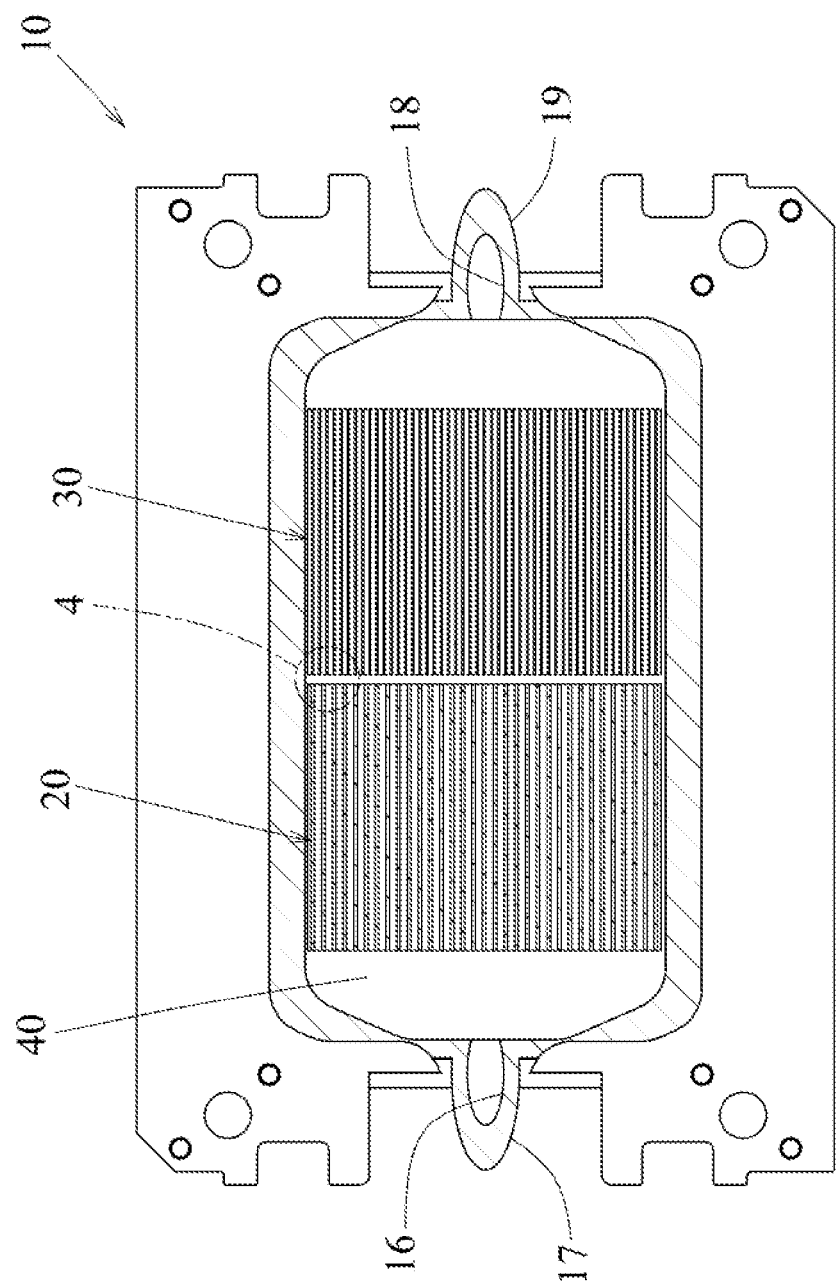
FIG. 3 is the 3-3 sectional view of FIG. 2.
Figure 4:
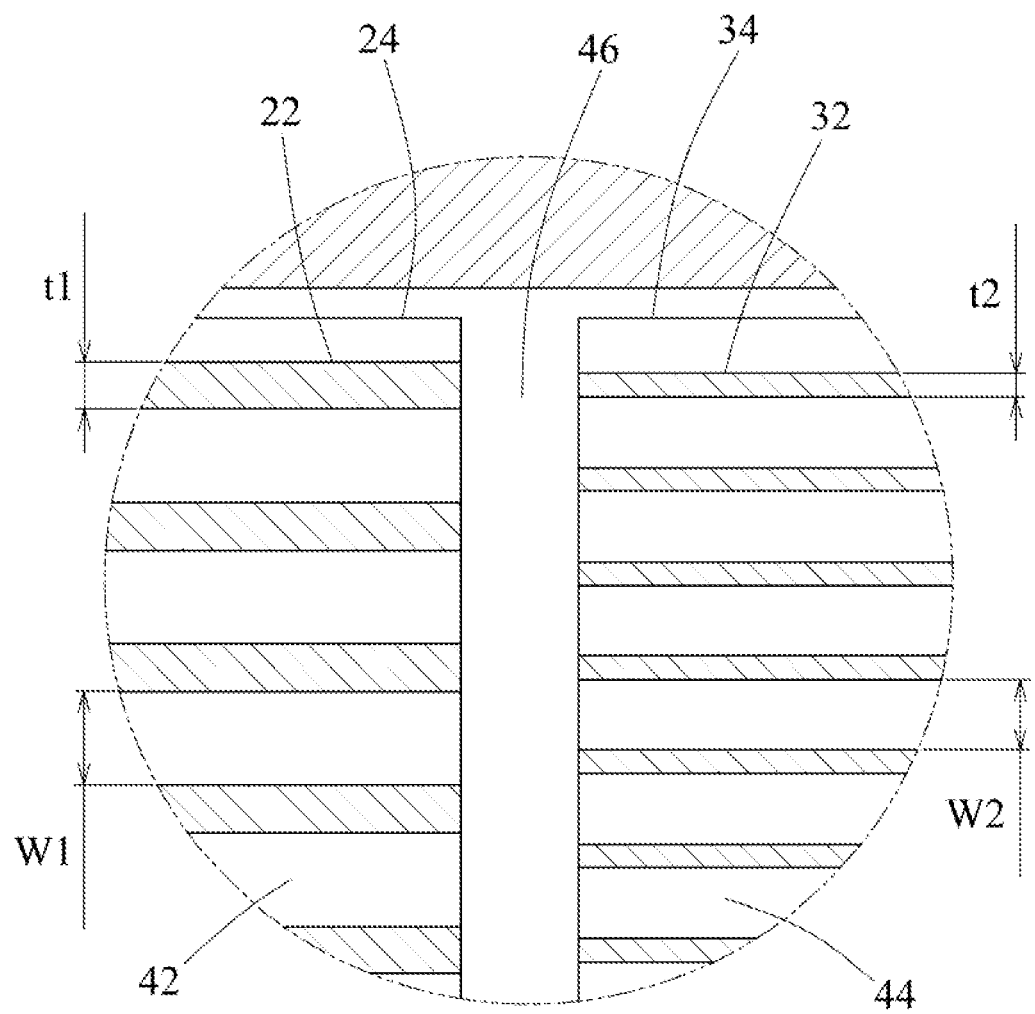
FIG. 4 is a drawing of the partial enlargement of FIG. 3.
Figure 5:
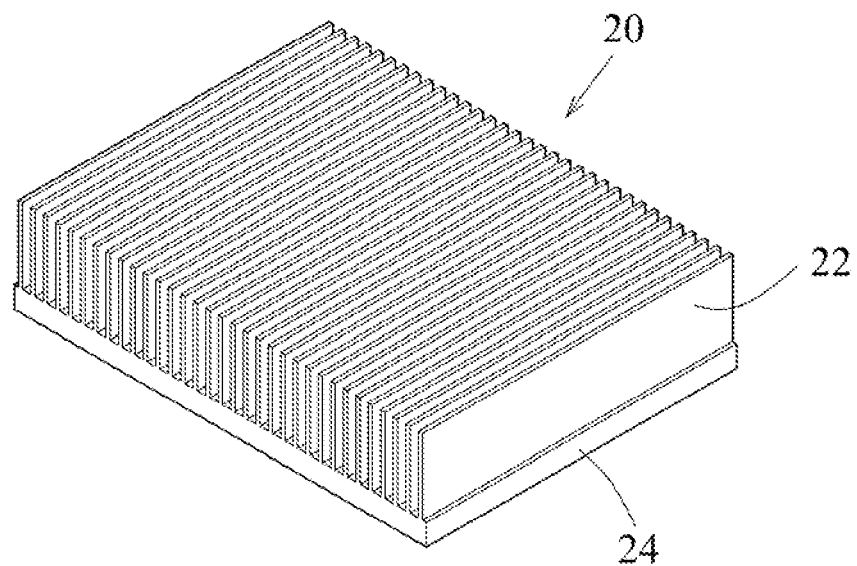
FIG. 5 is a stereogram of the first fin set in the preferred embodiment of the present invention.
Figure 6:
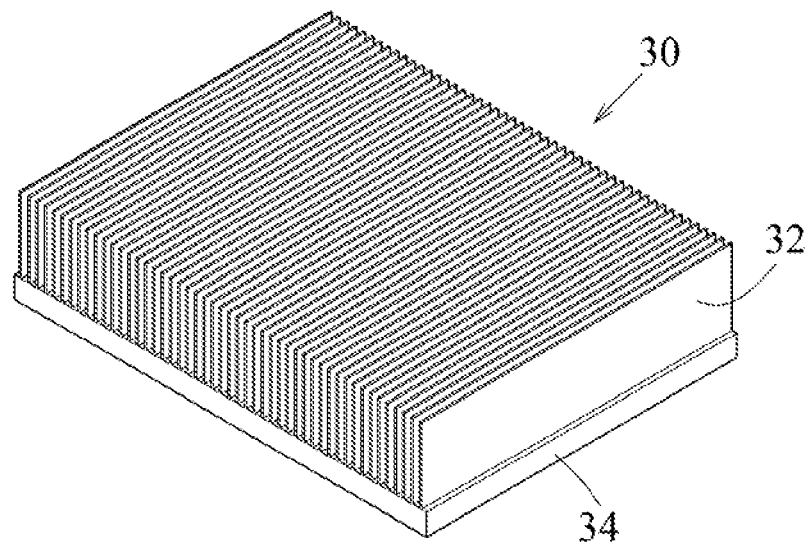
FIG. 6 is a stereogram of the second fin set in the preferred embodiment of the present invention.

The thickness direction of the first fins 22 and the second fins 32 is orthogonal to the flow direction of the cooling water 94. The width direction of the chamber 40 is defined as parallel with the thickness direction of the first fins 22 and the second fins 32. The first fins 22 are arranged in the width direction of the chamber 40. The second fins 32 are arranged in the width direction of the chamber 40, as shown in FIG. 3 and FIG. 4. As the thickness t1 of the first fin 22 is larger than the thickness t2 of the second fin 32, the width W1 of the first channels 42 is larger than the width W2 of the second channels 44, the quantity of the first fins 22 is smaller than the quantity of the second fins 32. The width direction of the chamber 40 points at the upper or lower part of FIG. 3 and FIG. 4

Further, the second plate 14 has a heat release side 142, one side of the second plate 14 facing the chamber 40 is the second surface 144, the heat release side 142 and the second surface 144 are opposite to each other in the thickness direction of the second plate 14. The first fins 22 and the second fins 32 prop the second surface 144 respectively, so that the first fins 22 and the second fins 32 transfer heat energy to the second plate 14 respectively, and the heat energy is released to the outside through the heat release side 142. The first fins 22 and the second fins 32 can be connected to the second surface 144 respectively. The first fins 22 and the second fins 32 can be connected to the second surface 144 by soldering or bonding or other means which can combine the first fins 22 and the second fin 32 with the second plate 14 respectively.

The first fins 22 and the second fins 32 are in contact with or connected to the second surface 144 respectively, the heat energy can be transferred to the second plate 14 through the first fins 22 and the second fins 32. The heat energy is released to the outside through the heat release side 142, the heat sinking efficiency is further increased, as shown in FIG. 9, the heat release side 142 can be provided with a heat sink 96 as required. The heat sink 96 can be a constant temperature plate or a cooling chip or other heat sinks. Additionally, the heat release side 142 can be provided with another water cooling head demonstrated in the preferred embodiment.

The first fins 22 and the second fins 32 can be in proximity to instead of in contact or connection with the second surface 144 respectively, so as to form another embodiment not shown in the figures. The another embodiment is evolved from the preferred embodiment.

The main body 10 has a first pipe 17 and a second pipe 19 as required, wherein the inlet channel 16 extends to the first pipe 17, and the outlet channel 18 extends to the second pipe 19, hereby two connecting pipes 98 can be connected to the first pipe 17 and the second pipe 19 respectively, so that the cooling water 94 is conducted through one of the connecting pipes 98 to the inlet channel 16, and the other connecting pipe 98 delivers the cooling water 94 which has absorbed the heat energy.

We claim:

1. A water cooling head assembly comprising:
a main body having a first plate and a second plate, the first plate and the second plate being opposite each other, said main body defining an inlet channel and an outlet channel;
a chamber formed inside said main body and positioned between the first plate and the second plate, said chamber communicating with the inlet channel and the outlet channel such that a cooling water is flowable into said chamber through the inlet channel and is flowable out of said chamber through the outlet channel;
a first fin set arranged in said chamber, said first fin set having a plurality of fins in spaced relation to each other, said first fin set being connected to said first plate and adapted to absorb and guide heat energy of the first plate, the plurality of fins of said first fin set dividing said chamber so as to form a plurality of first channels;
a second fin set arranged in said chamber, said second fin set having a plurality of fins in spaced relation to each other, said second fin set being connected to said first plate and adapted to absorb and guide the heat energy of said first plate, the plurality of fins of said second fin set dividing said chamber so as to form a plurality of second channels, wherein said first fin set is adjacent the inlet channel, said second fin set being positioned between said first fin set and the outlet channel, said chamber forming a communication region between said first fin set and said second fin set, the communication region communicating with the plurality of first channels and the plurality of second channels such that the cooling water flows into said chamber through said inlet channel and flows out of said chamber through the plurality of first channels and the communication region and the plurality of second channels and the outlet channel, wherein a thickness of a fin of said first fin set is larger than a thickness of a fin of said second fin set, wherein a total surface area of the plurality of fins of said first fin set is less than a total surface area of the plurality of fins of said second fin set, wherein a total volume of the plurality of first channels is defined as $\Sigma V1$ and a total volume of the plurality of second channels is defined as $\Sigma V2$, $\Sigma V1$ is approximately equal to $\Sigma V2$, wherein $0.9 \cdot \Sigma V1 < \Sigma V2 < 1.1 \cdot \Sigma V1$.

2. A water cooling head assembly comprising:
a main body having a first plate and a second plate, the first plate and the second plate being opposite each other, said main body defining an inlet channel and an outlet channel;
a chamber formed inside said main body and positioned between the first plate and the second plate, said chamber communicating with the inlet channel and the outlet channel such that a cooling water is flowable into said chamber through the inlet channel and is flowable out of said chamber through the outlet channel;
a first fin set arranged in said chamber, said first fin set having a plurality of fins in spaced relation to each other, said first fin set being connected to said first plate and adapted to absorb and guide heat energy of the first plate, the plurality of fins of said first fin set dividing said chamber so as to form a plurality of first channels;
a second fin set arranged in said chamber, said second fin set having a plurality of fins in spaced relation to each other, said second fin set being connected to said first plate and adapted to absorb and guide the heat energy of said first plate, the plurality of fins of said second fin set dividing said chamber so as to form a plurality of second channels, wherein said first fin set is adjacent the inlet channel, said second fin set being positioned between said first fin set and the outlet channel, said chamber forming a communication region between said first fin set and said second fin set, the communication region communicating with the plurality of first channels and the plurality of second channels such that the cooling water flows into said chamber through said inlet channel and flows out of said chamber through the plurality of first channels and the communication region and the plurality of second channels and the outlet channel, wherein a thickness of a fin of said first fin set is larger than a thickness of a fin of said second fin set, wherein a total surface area of the plurality of fins of said first fin set is less than a total surface ara of the plurality of fins of said second fin set, wherein one side of the first plate facing said chamber is a first surface, said first fin set and said second fin set closely contacting the first surface respectively, the first plate having a heat absorption side, the heat absorption side and said first surface are opposite to each other in a thickness direction of the first plate such that the first plate contacts a heat source through the heat absorption side and transfers a heat energy of the heat source to said first fin set and said second fin set, wherein said first fin set has a first basal disc, the first basal disc closely contacting said first surface, the plurality of first fins being arranged vertically on the first basal disc.

3. The water cooling head assembly of claim 2, wherein said second fin set has a second basal disc, the second basal disc closely contacting the first surface, the plurality of second fins are vertically arranged on said second basal disc.

4. The water cooling head assembly of claim 1, wherein a width of each channel of the plurality of first channels is wider than the width of each channel of the plurality of second channels, a quantity of the plurality of fins of said first fin set is greater than a quantity of the plurality of second fins.

5. The water cooling head assembly of claim 2, wherein a width of each channel of the plurality of first channels is wider than the width of each channel of the plurality of second channels, a quantity of the plurality of fins of said first fin set is greater than a quantity of the plurality of second fins.

6. The water cooling head assembly of claim 3, wherein a width of each channel of the plurality of first channels is wider than the width of each channel of the plurality of second channels, a quantity of the plurality of fins of said first fin set is greater than a quantity of the plurality of second fins.

7. The water cooling head assembly of claim 1, wherein said second plate has a heat release side, one side of the second plate facing said chamber is the second surface, the heat release side and the second surface are opposite to each other in a thickness direction of the second plate, the plurality of fins of said first fin set and the plurality of fins of said second fin set prop the second surface respectively so that the plurality of fins of said first fin set and the plurality of fins of said second fin sets transfer heat energy to the second plate respectively such that heat energy is released through the heat release side.

8. The water cooling assembly of claim 1, wherein said main body has a first pipe and a second pipe, the inlet channel extending to the first pipe, the outlet channel extending to the second pipe.

* * * * *